(12) United States Patent
Kurita et al.

(10) Patent No.: US 10,487,401 B2
(45) Date of Patent: Nov. 26, 2019

(54) DIFFUSER TEMPERATURE CONTROL

(71) Applicant: Applied Materials, Inc., Santa Clara, CA (US)

(72) Inventors: Shinichi Kurita, San Jose, CA (US); Robin L. Tiner, Santa Cruz, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 48 days.

(21) Appl. No.: 15/277,345

(22) Filed: Sep. 27, 2016

(65) Prior Publication Data

US 2017/0096738 A1 Apr. 6, 2017

Related U.S. Application Data

(60) Provisional application No. 62/236,713, filed on Oct. 2, 2015.

(51) Int. Cl.
*C23C 16/455* (2006.01)

(52) U.S. Cl.
CPC .............................. *C23C 16/45565* (2013.01)

(58) Field of Classification Search
CPC .......... C23C 16/45565; C23C 16/5096; C23C 16/4557; H01J 37/32724; H01J 37/32522; H01J 37/32449

USPC ..................................................... 156/345.34
See application file for complete search history.

(56) References Cited

U.S. PATENT DOCUMENTS

| | | | |
|---|---|---|---|
| 2008/0156440 A1* | 7/2008 | Sago | C23C 16/45565 156/345.34 |
| 2009/0071403 A1 | 3/2009 | Choi et al. | |
| 2009/0071406 A1* | 3/2009 | Choi | C03C 17/002 118/724 |
| 2009/0178614 A1* | 7/2009 | Kasai | C23C 16/45565 118/708 |
| 2014/0174361 A1 | 6/2014 | Chen et al. | |

* cited by examiner

*Primary Examiner* — Kambiz Zand
*Assistant Examiner* — Mirza Israr Javed
(74) *Attorney, Agent, or Firm* — Patterson + Sheridan LLP

(57) ABSTRACT

A PECVD chamber is disclosed with a temperature controlled gas distribution showerhead. The gas distribution showerhead is temperature controlled heated by circulating a g fluid through conduit formed within or coupled to the gas distribution showerhead. The PECVD chamber comprises a gas distribution showerhead, a backing plate coupled to the gas distribution showerhead, the backing plate having a bottom surface facing and substantially parallel with and spaced from an upper surface of the gas distribution showerhead; and a temperature controlling device coupled to the gas distribution showerhead and disposed between the backing plate and the gas distribution showerhead.

13 Claims, 3 Drawing Sheets

DIFFUSER TEMPERATURE CONTROL

CROSS-REFERENCE TO RELATED APPLICATIONS

This application claims benefit of U.S. Provisional Application Ser. No. 62/236,713 filed Oct. 2, 2015, which is incorporated by reference in its entirety.

BACKGROUND

Field

Embodiments of the present disclosure generally relate to a plasma enhanced chemical vapor deposition (PECVD) chamber and cleaning methods.

Description of the Related Art

PECVD is generally employed to deposit thin films on substrates, such as organic light emitting diode (OLED) substrates and semiconductor substrates. PECVD is generally accomplished by introducing a precursor gas into a vacuum chamber having a substrate disposed on a substrate support. The precursor gas is typically directed through a gas distribution showerhead situated near the top of the vacuum chamber. The precursor gas in the vacuum chamber is excited into a plasma by applying an RF power to a chamber electrode from one or more RF sources coupled to the chamber. The plasma forms a layer of material on a surface of a substrate that is positioned on a substrate support. The gas distribution showerhead is generally connected to an RF power source and the substrate support is typically connected to the chamber body to create an RF power return path.

The process temperature of PECVD processes varies depending on the types of processes. Some processes, such as thin film encapsulation (TFE), require a low temperature. During a TFE process, the temperature of the substrate support is typically maintained at around 80 degrees Celsius. Other thin film depositions using PECVD may maintain the temperature of the substrate support at over 200 degrees Celsius. A PECVD chamber may have residue from the deposition process collecting on the walls and other surfaces, thus a routine cleaning is needed. A low temperature negatively affects the cleaning rate. Inadequate temperature control in the processing chamber may adversely affect deposition efficiency, gas flow distribution, deposited film profile uniformity and chamber cleanness control.

Thus, an improved method and apparatus is needed to enhance temperature control during a cleaning process and deposition process performed in a PECVD chamber.

SUMMARY

The present disclosure generally relates to a temperature controlled diffuser in a PECVD chamber. The diffuser (e.g., a gas distribution showerhead) is heated or cooled (e.g., temperature controlled) by circulating a fluid at a predetermined temperature range either through channels formed within the diffuser or a tube coupled to the diffuser. The fluid provides thermal energy to the gas distribution showerhead, which improves the temperature control during a deposition or cleaning process of the PECVD chamber.

In one embodiment, a plasma enhanced chemical vapor deposition chamber includes a gas distribution showerhead, a backing plate coupled to the gas distribution showerhead, the backing plate having a bottom surface facing and substantially parallel with and spaced from an upper surface of the gas distribution showerhead, and a temperature controlling device coupled to the gas distribution showerhead and disposed between the backing plate and the gas distribution showerhead.

In another embodiment, a PECVD chamber comprises a gas distribution showerhead, a backing plate coupled to the gas distribution showerhead, and a conduit coupled to the gas distribution plate and disposed between the gas distribution showerhead and the backing plate.

In yet another embodiment, a method of controlling a temperature of a gas distribution showerhead includes forming a plasma in a processing region defined in a processing chamber, and directing a fluid into a conduit coupled to a gas distribution showerhead disposed in the processing chamber, wherein the conduit is disposed between the gas distribution showerhead and a backing plate disposed in the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a temperature controlled diffuser (e.g., a gas distribution showerhead) utilized in a PECVD chamber. The diffuser is temperature controlled by circulating a fluid at a desired temperature range either through channels formed within the diffuser or a tube coupled to the diffuser. The temperature controlled diffuser may efficiently maintain the diffuser at a desired temperature during a deposition process or a cleaning process, which improves the cleaning and depositing efficiency of the PECVD chamber that performs at different temperature regimes as needed.

The description herein will be made with reference to a PECVD chamber available from AKT America, Inc., a subsidiary of Applied Materials, Inc., Santa Clara, Calif. It is to be understood that the embodiments herein are equally applicable to other processing chambers as well, including processing chambers sold by other manufacturers.

Figure 1:
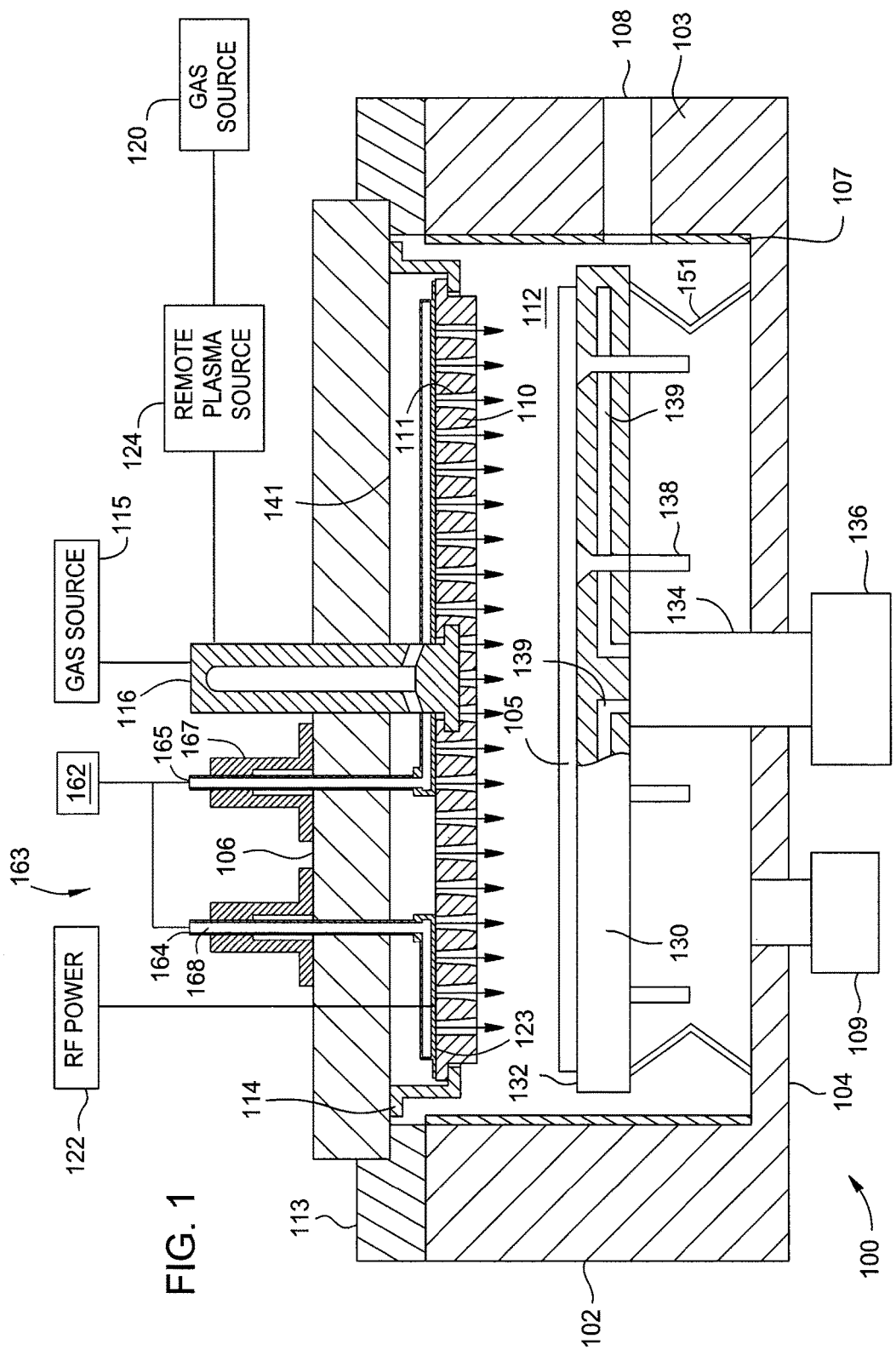
FIG. 1 is a cross sectional view of a PECVD apparatus according to one embodiment of the disclosure.

FIG. 1 is a schematic cross-section view of one embodiment of a PECVD chamber 100 for forming electronic devices, such as TFT's and OLED's. It is noted that the PECVD chamber 100 shown in FIG. 1 is just an exemplary apparatus that may be used to form electronic devices on a substrate. One suitable PECVD chamber is available from AKT, Inc., a subsidiary of Applied Materials, Inc., located in Santa Clara, Calif. It is contemplated that other deposition chambers, including those from other manufacturers, may be utilized to practice the present disclosure.

The PECVD chamber 100 generally includes walls 102, a bottom 104, and a backing plate 106 which define a process volume 112. In some embodiments, the PECVD chamber 100 may include a lid plate 113 that interfaces with the backing plate 106 and the walls 102, and the lid plate 113 would form part of the process volume 112. At least the walls 102, the bottom 104 and the backing plate 106 collectively form a body 103 of the PECVD chamber 100. A gas distribution plate or diffuser 110 and a substrate support 130 are disposed in the process volume 112. The process volume 112 is accessed through a sealable port 108 formed through the walls 102 such that a substrate 105 may be transferred into and out of the PECVD chamber 100. The substrate support 130 includes a substrate receiving surface 132 for supporting the substrate 105. A RF return path 151 may be coupled between the substrate support 130 and the bottom 104 of the chamber body 103. A stem 134 that is coupled to a lift system 136 is utilized to raise and lower the substrate support 130 relative to the diffuser 110. Lift pins 138 are moveably disposed through the substrate support 130 to space the substrate 105 away from the substrate receiving surface 132 when the substrate support 130 is lowered toward the bottom 104 in order to facilitate substrate transfer.

The diffuser 110 is coupled to the backing plate 106 at a periphery of the diffuser 110 by a suspension 114. The diffuser 110 may also be coupled to the backing plate 106 by a center support 116 to help prevent sag and/or control the straightness/curvature of the diffuser 110. The backing plate 106 is coupled to the diffuser 110. The backing plate 106 has a bottom surface 141 facing an upper surface 123 of the diffuser 110. The bottom surface 141 of the backing plate 106 is substantially parallel with and spaced apart from the upper surface 123 of the diffuser 110. A process gas source 115 may be coupled to the center support 116 to provide gases through the backing plate 106 that is distributed through a plurality of passages 111 formed in the diffuser 110. A cleaning gas source 120 may be coupled to the center support 116 to provide gases through the backing plate 106 that is distributed through the plurality of passages 111 formed in the diffuser 110. The gases flow through the diffuser 110 toward the substrate 105 and/or the substrate receiving surface 132 of the substrate support 130. A vacuum pump 109 is coupled to the PECVD chamber 100 to control the pressure within the process volume 112. A radio frequency (RF) power source 122 is coupled to the backing plate 106 and/or to the diffuser 110 to provide RF power to the diffuser 110. The RF power source 122 is utilized to generate an electric field between the diffuser 110 and the substrate support 130 so that a plasma may be formed when gases present between the diffuser 110 and the substrate support 130. Various RF frequencies may be used, such as a frequency between about 0.3 MHz and about 200 MHz. In one embodiment, the RF power source 122 provides power to the diffuser 110 at a frequency of 13.56 MHz.

A temperature control device 163 is coupled to an upper surface 123 of the diffuser 110 facing a bottom surface 141 of the backing plate 106. A clamp 167 may be utilized to secure the temperature control device 163 to the upper surface 123 of the diffuser 110. The temperature control device 163 includes a conduit 168 for flowing a heat transfer fluid therein. Suitable heat transfer fluids may include ethylene glycol, oils, as well as other heat transfer fluids, such as a commercially available GALDEN® fluid. The heat transfer fluid may include about a 20 kilowatt heating and cooling capacity. The conduit 168 may include an inlet port 164 and an outlet port 165. A heat exchanger 162 is coupled to the conduit 168 through the inlet port 164 and the outlet port 165 to control the temperature of the heat transfer fluid flowing through the conduit 168 of the temperature control device 163. Details regarding the structure of the temperature control device 163 will be further described below in FIG. 2.

A remote plasma source 124, such as an inductively coupled remote plasma source, may also be coupled between the gas source 126 and the backing plate 106. In the embodiment shown, the remote plasma source 124 is coupled to the backing plate 106. However, in some embodiments, the remote plasma source 124 may be coupled to the walls 102. Between processing substrates, a cleaning gas may be provided to the remote plasma source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases provided by the cleaning gas source 120 include, but are not limited to, nitrogen fluoride ($NF_3$) fluorine gas ($F_2$) and sulfur hexafluoride ($SF_6$).

Process gases in the process gas source 115 may include silicon containing and/or nitrogen containing precursor gases, such as silanes e.g., $SiH_4$ and ammonia ($NH_3$). The process gases are excited into a plasma using the RF power source 122 to deposit silicon nitride (SiN) for forming, as one example, an encapsulation layer on an OLED device on the substrate 105.

When the plasma is formed, heat is generated in the process volume 112. The heat radiates into the interior surfaces of the PECVD chamber 100 which raises the temperature of components in the process volume 112. For example, the temperature of components such as the substrate support 130, the walls 102, the backing plate 106 as well as the diffuser 110 may rise due to the heat from the plasma in the process volume 112.

In OLED devices, the temperature of the substrate 105 is important. For example, in forming encapsulation layers on features formed on the substrate 105, temperature of the substrate 105 should be controlled such that encapsulation layers are formed in a uniform manner. Further, temperatures above about 100 degrees Celsius have been shown to damage features on the substrate 105.

The substrate support 130 may also include one or more heating elements 139 and/or one or more temperature control devices 163 to maintain the substrate support 130 and substrate 105 positioned thereon at a desired temperature. The one or more heating elements 139 may be a heater device, such as a resistive heater, while the temperature control devices may be a cooling or heating device. In one embodiment, the heating elements 139 may be utilized to maintain the temperature of the substrate support 130 and substrate 105 thereon during deposition. The temperature of the substrate 105 may be less than 100 degrees Celsius, such as between 20 degrees Celsius and about 90 degrees Celsius.

In some embodiments, the PECVD chamber 100 also includes one or more thermal insulators disposed in the process volume 112 and are shown as a liner 107. The one or more thermal insulators may be utilized to reduce heat transfer from the substrate support 130 to the body 103 of the PECVD chamber 100. The one or more thermal insulators may also be utilized to reduce heat transfer from the diffuser 110 to the backing plate 106. The liner 107 may be utilized to facilitate a constant temperature within the process volume 112 of the PECVD chamber 100 by reducing thermal losses from the various components within or surrounding the process volume 112.

Figure 2:
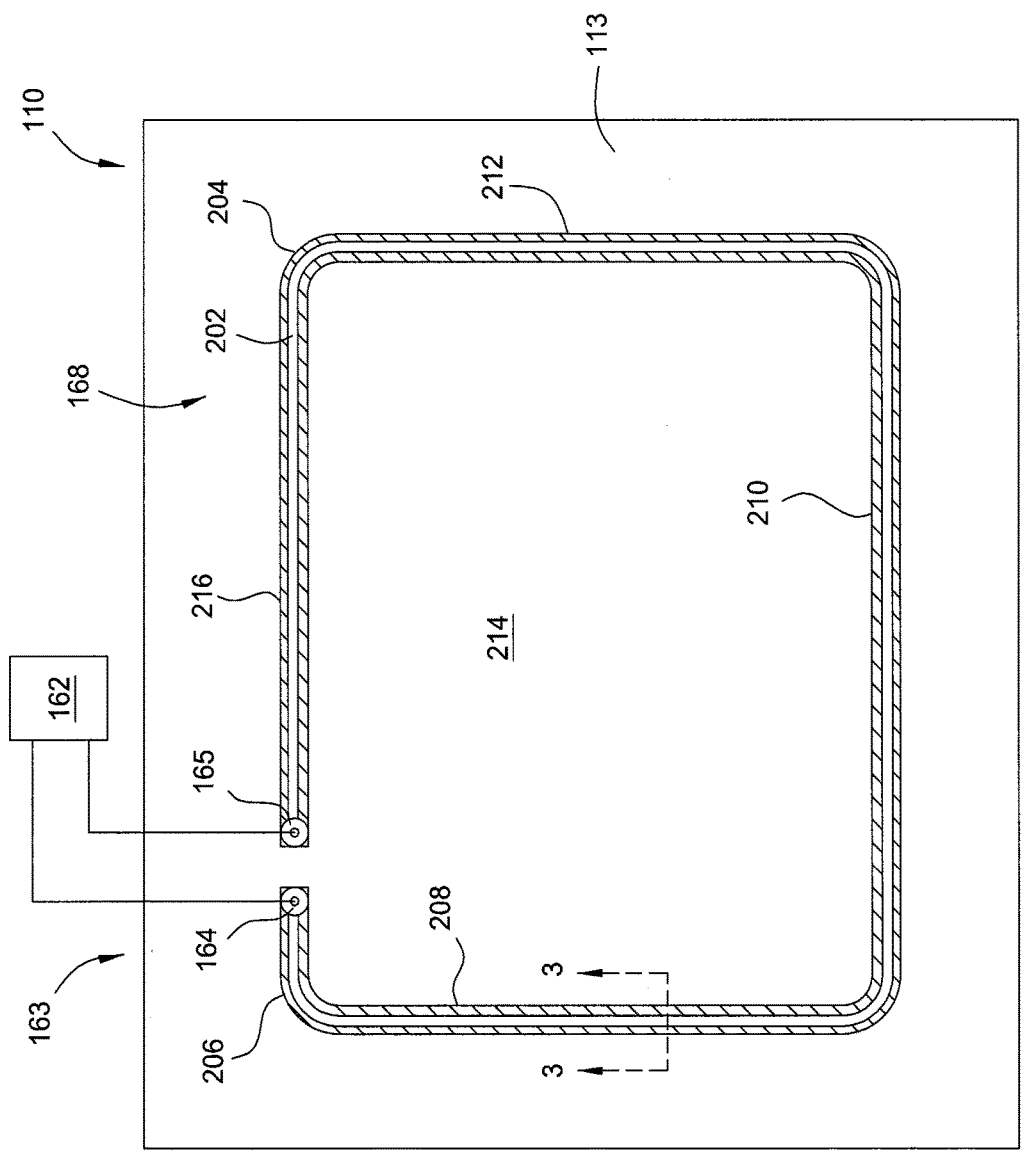
FIG. 2 is a top view of a diffuser according to one embodiment of the disclosure.

FIG. 2 is a top view of the diffuser 110 described in FIG. 1. The conduit 168 is disposed above the surface 123 of the diffuser 110. Alternatively, the conduit 168 may be formed embedded within the body of the diffuser 110 below the surface 123 of the diffuser 110, thus forming channels within the diffuser 110. The conduit 168 forms a continuous path in the diffuser 110. The conduit 168 may be made of an electrically insulating material. In one embodiment, the conduit 168 is made of polytetrafluoroethylene (PTFE). The conduit 168 may be formed in any pattern that provides a good coverage of the diffuser 110. In one embodiment, the conduit 168 is formed in a rectangular form having four sides each parallel to each side of the diffuser 110. The conduit 168 is connected to the heat exchanger 162. In operation, a fluid is heated to a predetermined temperature by the heat exchanger 162 and enters into the conduit 168 through the inlet port 164 and then circulates through the conduit 168 to elevate the temperature of the diffuser 110. The heated fluid then exits the conduit 168 through the outlet port 165 back to the heat exchanger 162, forming a close loop for continuous circulation. Any organic heat transfer fluid may be used as the heating fluid. In one embodiment, a GALDEN® heat transfer fluid is used. The heating fluid may elevate the temperature of the diffuser 110 to around 150 degrees Celsius. The heated diffuser 110 in turn provides thermal energy to the gases or plasma generated from the gases in the process volume 112 by conduction and radiation. A higher temperature in the gases or plasma from the gases in the process volume increases the deposition or cleaning efficiency of the PECVD chamber 100, thus improving the process performance and overall chamber operating efficiency.

In one example, the conduit 168 may include a channel 202 defined within an outer casting 204. The outer casting 204 may be made of a metal such as aluminum, stainless steel, or copper, in order to effectively transfer heat to the diffuser 110 from the heating fluid. The clamp 167 (shown in FIG. 1) may be made of metal as well or any suitable insulating material as needed to secure the temperature control device 163 onto the diffuser 110.

In one embodiment, the conduit 168 comprises four straight sides 208, 212, 210, 216 arranged in a polygon and defining a center opening 214. Two sides 216, 210 are parallel to each other and to two other sides of the diffuser 110 when implementing in the PECVD chamber 100. The other two sides 212, 208 are parallel to each other and to the other two sides of the diffuser 110. The conduit 168 is a single continuous tube that bends at the corners to form the four sides 216, 212, 210, 208. Alternatively, the conduit 168 may comprise a plurality of individual tubes. For example, the conduit 168 may comprise four straight tubes connected by four elbow shaped connectors at the corners. The conduit 168 has the inlet port 164 and the outlet port 165 (or vice versa) for a heating fluid to enter into and leave from the conduit 168. The heat exchanger 162 in FIGS. 1 and 2 is coupled to the conduit 168 at the inlet port 164 and the outlet port 165.

Although the conduit 168 shown in FIGS. 1 and 2 is in rectangular form, it is noted that the conduit 168 may be in any forms or geometries, including a circular path, a tortuous path or suitable configurations, as long as a continuous flow path is formed for the fluid to flow therethrough in a close loop configuration back to the heat exchanger 162.

Figure 3:
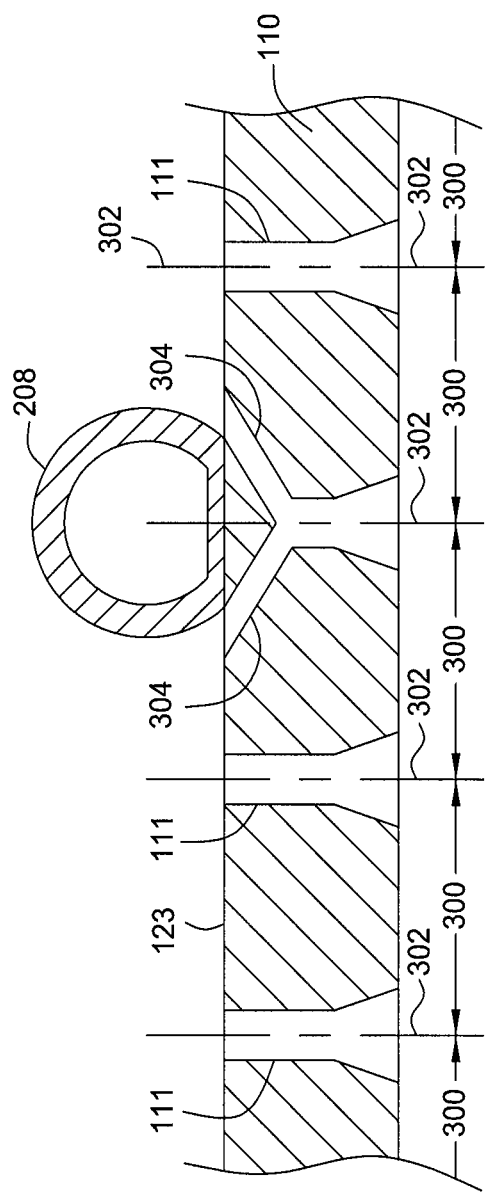
FIG. 3 is a partial cross sectional view of the diffuser.

FIG. 3 is a partial cross sectional view of the diffuser 110 taken through section line 3-3 of FIG. 2. The side 208 of the conduit 168 is disposed on the upper surface 123 of the diffuser 110. So that the flow uniformity through the passages 111 is not disrupted by the presence of the conduit 168, one or more feeder passages 304 are utilized to couple the passage 111 disposed under the side 208 of the conduit 168 to the plenum space above the upper surface 123 of the diffuser 110. The one or more feeder passages 304 are sized such that the conductance of fluid flowing through the passages 111 that are blocked and unblocked by the conduit 168 remain substantially equal. As a result, a pitch 300 between centerlines 302 of the passages 111 may remain constant while providing a uniform gas flow even through one or more of the passages 111 are disposed below the side 208 of the conduit 168, thereby promoting deposition uniformity.

In summary, a temperature controlled diffuser is utilized to elevate the temperature of gases or plasma formed from gases in a process volume defined in a PECVD chamber during a deposition or a cleaning process. As the result, the deposition or cleaning efficiency of a PECVD chamber that performs at wide different temperature processes, such as TFE, is improved. The diffuser may be heated with a heating fluid circulating through conduits formed within or above the surface of the diffuser. The diffuser may also be heated with a heating fluid circulating through a conduit coupled to the diffuser.

While the foregoing is directed to embodiments of the present disclosure, other and further embodiments of the disclosure may be devised without departing from the basic scope thereof, and the scope thereof is determined by the claims that follow.

What is claimed is:

1. A plasma enhanced chemical vapor deposition chamber, comprising:
   a gas distribution showerhead;
   a plurality of apertures formed in the gas distribution showerhead from a first surface to a second surface;
   a backing plate coupled to the gas distribution showerhead through the second surface, the backing plate having a bottom surface facing and spaced from the second surface of the gas distribution showerhead; and
   a temperature controlling device in direct contact with and horizontally and directly disposed on the second surface of the gas distribution showerhead and disposed between the backing plate and the gas distribution showerhead.

2. The chamber of claim 1, wherein the temperature controlling device further comprises:
   a conduit coupled to the gas distribution showerhead.

3. The chamber of claim 2, wherein the temperature controlling device further comprises:
   a heat exchanger coupled to the conduit.

4. The chamber of claim 3, wherein the heat exchanger is coupled to the conduit through an inlet port and an outlet port of the temperature controlling device.

5. The chamber of claim 2, wherein the conduit includes a channel defined in an outer casting.

6. The chamber of claim 2, wherein the conduit comprises four sides arranged in a polygon, wherein two sides are parallel to each other and to two sides of the gas distribution showerhead.

7. The chamber of claim 2, wherein the four sides of the conduit defining a center opening.

8. The chamber of claim 1, wherein the gas distribution showerhead comprises:

a plurality of gas passages for allowing fluid to pass through the gas distribution showerhead, wherein a pitch between the passages are not interrupted by conduit.

9. The chamber of claim 2, wherein the conduit is embedded within the gas distribution showerhead.

10. The chamber of claim 1, wherein the conduit forms the tortuous path in the gas distribution showerhead or adjacent to the gas distribution showerhead.

11. The chamber of claim 9, wherein the conduit comprises aluminum, stainless steel, or copper.

12. The chamber of claim 2, wherein the conduit comprises four straight tubes connected by four elbow shaped connectors at corners.

13. The chamber of claim 2, wherein the conduit is coupled to the gas distribution showerhead by a clamp.

\* \* \* \* \*